United States Patent [19]

King et al.

[11] Patent Number: 5,401,982
[45] Date of Patent: Mar. 28, 1995

[54] REDUCING LEAKAGE CURRENT IN A THIN-FILM TRANSISTOR WITH CHARGE CARRIER DENSITIES THAT VARY IN TWO DIMENSIONS

[75] Inventors: Tsu-Jae King, Cupertino; Michael G. Hack, Mountain View, both of Calif.

[73] Assignee: Xerox Corporation, Stamford, Conn.

[21] Appl. No.: 205,974

[22] Filed: Mar. 3, 1994

[51] Int. Cl.$^6$ ............................................. H01L 29/78
[52] U.S. Cl. ........................................ 257/59; 257/66; 257/72; 257/349; 257/354
[58] Field of Search ................. 257/349, 354, 347, 72, 257/59, 352, 66, 408

[56] References Cited

U.S. PATENT DOCUMENTS

| | | | |
|---|---|---|---|
| 5,125,007 | 6/1992 | Yamaguchi et al. | 257/349 X |
| 5,293,052 | 3/1994 | Cherne et al. | 257/349 |
| 5,323,042 | 6/1994 | Matsumoto | 257/72 X |
| 5,359,219 | 10/1994 | Hwang | 257/349 X |

FOREIGN PATENT DOCUMENTS 0497216 8/1992 European Pat. Off. ............ 257/349

OTHER PUBLICATIONS

Wu, I—W., Lewis, A., and Chiang, A., "Effects of Solid Phase Crystallization and LDD Doping on Leakage Current Distributions in Poly—Si TFTs with Multiple Gate Structures," *Digest of Japan Displays*, 1992, pp. 455–458.

Hack, M., Wu, I—W., King, T. J. and Lewis, kA. G., "Analysis of Leakage Currents in Poly—Silicon Thin Film Transistors," 1993 *International Electron Devices Meeting Technical Digest*, pp. 385–388.

Wu, I—W., King, T. J., Hack, M., Tsai, C. C., Lewis, A. G., and Chiang, A., "Leakage Currents in Polycrystalline Silicon Thin Film Transistors for Liquid Crystal Displays," *Proceedings of 1993 International Semiconductor Device Research Symposium*, Dec. 1–3, 1993, Charlottesville, 1993, pp. 21–24.

Wei, C—Y., Pimbley, J. M., and Nissan—Cohen, Y., "Buried and Graded/Buried LDD Structures for Improved Hot—Electron Reliability," *IEEE Electron Device Letters*, vol. EDL—7, No. 6, Jun. 1986, pp. 380–382.

Nakazawa, K., Tanaka, K., Suyama, S., Kato, K., and Kohda, S., "Lightly Doped Drain TFT Structure for Poly-Si LCDs," *SID 90 Digest*, 1990, pp. 311–314.

Kitajima, H., Suzuki, Y., and Saita, S., "Leakage Current Reduction in Sub-Micron Channel Poly-Si TFTs," *Extended Abstracts of the 1991 International Conference on Solid State Devices and Materials*, Yokohama, 1991, 1991, pp. 174–176.

*Primary Examiner*—William Mintel

[57] ABSTRACT

In the channel layer of a thin film transistor (TFT), a channel and its drain meet at a transition within a transition region. The channel extends in a first, or horizontal, dimension away from the drain and extends in a second, or vertical, dimension from a side away from the gate to a side toward the gate. The charge carrier densities in the transition region vary in the second dimension in a way that reduces leakage current, because the position of the maximum electric field is moved away from the gate and its magnitude is reduced. Variation of densities in the second dimension can be produced by high angle implantation of a dopant and a counterdopant, providing a transition region between the drain and the channel underneath the gate. Variation of densities in the second dimension can also be produced with non-angled implantation by a process in which a sidewall spacer offsets the drain, providing a transition region that is between the drain and the channel and that can be doped independently of the drain. In a symmetric TFT in which either channel lead can function as a drain, charge carrier densities can vary in the second dimension at the transitions between each channel lead and the channel.

10 Claims, 10 Drawing Sheets

REDUCING LEAKAGE CURRENT IN A THIN-FILM TRANSISTOR WITH CHARGE CARRIER DENSITIES THAT VARY IN TWO DIMENSIONS

BACKGROUND OF THE INVENTION

The present invention relates to thin-film structures such as transistors.

Wu, I-W., Lewis, A., and Chiang, A., "Effects of Solid Phase Crystallization and LDD Doping on Leakage Current Distributions in Poly-Si TFTs with Multiple Gate Structures," Digest of Japan Displays, 1992, pp. 455–458, state that, to reduce the leakage current in polycrystalline-silicon thin-film transistors (poly-TFTs), it is necessary to reduce either the trap-state density or the electric field at the drain junction. The introduction on page 455 indicates that, for poly-TFTs, solid-phase crystallization (hence grain size), gate-to-drain offset LDD structures, and multiple gate structures can be used to achieve a high level of leakage current control. The description of FIG. 2(a) on page 455 indicates that the reduction in leakage with increasing number of gates is due to a decrease of electric field strength in the drain region. On the other hand, the slopes of leakage current versus negative gate bias are not reduced for different numbers of gates. FIG. 9 shows double gate TFT ON/OFF currents with respect to LDD phosphorus implant dose for a gate-to-source/drain (S/D) offset of 1.0 $\mu$m, normalized to leakage and drive current of a TFT without gate-offset regions. The lightly doped S/D reduces leakage by reducing the drain electric field.

SUMMARY OF THE INVENTION

The invention can be applied to reduce leakage current in thin film structures such as thin film transistors (TFTs). Several applications of TFTs such as active-matrix liquid-crystal displays (AMLCDs) or image sensors have stringent leakage current requirements.

Previous experimental studies have shown two main factors that affect leakage current in polycrystalline silicon (poly-Si) TFTs: One factor is the distribution and density of trap-states in a region of the channel near the channel lead that is serving as a drain; the other factor is the maximum electric field strength that occurs in the same region of the channel when the TFT is nominally in the OFF state. Low trap-state densities and low maximum field strengths result in low leakage currents.

Conditions during TFT fabrication determine the distribution and density of trap-states. Conventional TFT fabrication processing techniques are subject to temperature constraints. For example, in conventional glass-substrate compatible processes, the temperature cannot exceed 600° C. At such low temperatures, it is difficult to obtain low trap-state densities. Low densities may only be available using unconventional techniques such as laser-annealing or rapid-thermal lamp-annealing.

Therefore, reducing maximum channel electric field strength in TFTs has been an important problem. If maximum channel electric field strength could be reduced, leakage current would also be reduced.

Reducing channel electric field is also a problem in single crystal devices because high electric fields reduce reliability due to hot carrier effects. Conventional techniques for reducing maximum electric field strength in short-channel nMOSFETs include, for example, double-diffused-drain (DDD) and lightly-doped drain (LDD) structures. In these structures, a lightly doped drain region is placed between a channel and a heavily doped drain region. The lightly doped region can be underneath the edge of the gate, as in a DDD structure or in a fully overlapped LDD structure. Or it can be aligned to or abutting the edge of the gate, as in a conventional LDD structure.

DDD and LDD techniques have proven impractical for poly-Si TFT applications. DDD structures are impractical because lateral dopant diffusion is poorly controlled and gate overlap capacitance increases. LDD is impractical because dopant activation in lightly doped poly-Si is poorly controlled and drive current decreases. Because of poor doping control, these techniques typically result in overdoping or underdoping of the LDD region. In addition, for symmetric pass transistors in which each channel lead can serve as a drain or as a source, such as in an AMLCD pixel, LDD is impractical because it severely reduces drive current at the source lead if the LDD region is underdoped. On the other hand, if the LDD region is overdoped, there is no reduction in electric field, and therefore no benefit.

The invention is based on the discovery of new techniques applicable to a TFT formed on an insulating substrate and having a channel layer that includes a channel extending between first and second channel leads. The new techniques position charge carriers at a transition between the first channel lead and the channel in ways that reduce leakage current.

One aspect of the invention provides a TFT with charge carrier sources in its channel layer. The channel layer includes first and second channel leads and a channel extending between them. The TFT has a gate extending alongside the channel. The TFT's channel extends in a first dimension away from the first channel lead and extends in a second dimension from a side away from the gate to a side toward the gate. The charge carrier densities vary in the second dimension at the transition between the first channel lead and the channel in such a way that less leakage current occurs when the first channel lead serves as the drain than would occur if the densities did not vary in the second dimension at the transition between the first channel lead and the channel. Therefore, the new techniques may make it feasible to use poly-Si TFTs in a low leakage current application such as an active-matrix liquid-crystal display or image sensor. Charge carrier densities can also vary in the second dimension at the transition between the second channel lead and the channel in a way that reduces leakage current when the second channel lead serves as the drain.

A second aspect of the invention provides techniques for making a product that includes a TFT. The techniques form circuitry on an insulating substrate, and the circuitry includes a TFT with a gate lead and a channel layer as described above. In forming the circuitry, the techniques positions charge carrier sources in the channel layer. The charge carrier sources are positioned to provide charge carriers at densities that vary in the first and second dimensions. The densities of the charge carriers vary in the second dimension at the transition between the first channel lead and the channel in such a way that a leakage current that occurs when the first channel lead serves as a drain for the transistor is less than a leakage current that would occur if the densities of charge carriers did not vary in the second dimension at the transition between the first channel lead and the channel.

The techniques can, for example, form a transition region between the first channel lead and the channel. The concentration of dopant in the transition region can be smaller than in the first channel lead and can vary in the second dimension. Although the transition region can be aligned with the edge of the gate lead, it may be effective even if it extends beyond the edge of the gate lead.

One technique forms a gate lead, and then implants particles at a high tilt angle and at sufficient energy to reach positions under the gate lead. The implanted particles can include a dopant and a counterdopant. Before or after implanting particles under the gate lead, the technique can implant particles of the dopant in areas not covered by the gate lead to form the first channel lead.

Another technique forms the gate lead and then implants dopant in areas not covered by the gate lead at densities that vary in the second dimension. This technique then forms a sidewall spacer, and then implants dopant at a higher concentration to form the first channel lead. As a result, the transition region is formed between the first channel lead and the channel.

The new techniques can be implemented in n-channel structures with charge carrier sources that are particles of an n-type dopant, or in p-channel structures with charge carrier sources that are particles of a p-type dopant. In either case, the channel itself could be undoped or lightly doped either with particles of an n-type dopant or particles of a p-type dopant.

The new techniques described above are advantageous because they permit control over leakage current in a TFT. The new techniques require less area than convention multiple gate techniques for controlling leakage current. The new techniques control leakage current by changing the electric field that occurs in the region between a channel and a channel lead. The leakage current is reduced if the point of maximum field strength occurs farther from the gate lead. Therefore, the new techniques may permit use of TFTs in applications with stringent leakage current requirements.

The following description, the drawings, and the claims further set forth these and other aspects, objects, features, and advantages of the invention.

BRIEF DESCRIPTION OF THE DRAWINGS

FIGS. 4–6 are schematic cross-section views of simulated transition regions, showing regions of higher and lower charge carrier densities. FIG. 4 shows a bottom only doping configuration, FIG. 5 a graded doping configuration, and FIG. 6 a reverse graded doping configuration.

DETAILED DESCRIPTION

A. Conceptual Framework

The following conceptual framework is helpful in understanding the broad scope of the invention, and the terms defined below have the indicated meanings throughout this application, including the claims. "Circuitry" or a "circuit" is any physical arrangement of matter that can respond to a first signal at one location or time by providing a second signal at another location or time.

A "substrate" or "chip" is a unit of material that has a surface at which circuitry can be formed or mounted. An "insulating substrate" is a substrate through which no electric current can flow. An "integrated circuit" is a circuit formed at a substrate's surface by batch processes such as deposition, lithography, etching, oxidation, diffusion, implantation, annealing, and so forth.

Any two components are "connected" when there is a combination of circuitry that can transfer signals from one of the components to the other. For example, two components are "connected" by any combination of connections between them that permits transfer of signals from one of the components to the other. Two components are "electrically connected" when there is a combination of circuitry that can transfer electric signals from one to the other. An "electric circuit" is a circuit within which components are electrically connected. An "electric structure" is a physical structure that includes one or more electric circuits.

A "thin-film structure" is an electric structure that is formed at a surface of an insulating substrate. A thin-film structure could be formed, for example, by deposition and patterned etching of films on the insulating substrate's surface.

A "lead" is a part of a component at which the component is electrically connected to other components. A "line" is a simple conductive component that extends between and electrically connects two or more leads. A lead of a component is "connected" to a lead of another component when the two leads are electrically connected by a combination of leads and lines. In an integrated circuit, leads of two components may also be "connected" by being formed as a single lead that is part of both components.

A "channel" is a part of a component through which electric current can flow. A "channel lead" is a lead that connects a channel in one component to other components. A channel may, for example, extend between two channel leads.

A "transition" occurs where a channel and a channel lead meet. A "transition region" is a region that includes a transition between a channel and a channel lead.

A "channel layer" of a thin-film structure is a layer of material that includes one or more channels. A channel layer may also include channel leads and transition regions.

Current flows through a channel "in a dimension" if the channel extends in the dimension between two channel leads and if current can flow through the channel from one of the channel leads to the other.

A "charge carrier" is a real or fictitious particle that can transport charge through a channel to produce a current; electrons and holes are examples of charge carriers. A "charge carrier source" is an ion, atom, molecule, or other feature of a channel that can provide a charge carrier. In an integrated circuit, an "n-channel" is a channel for which the majority of charge carrier sources provide charge carriers of negative sign such as electrons; a "p-channel" is a channel for which the majority of charge carrier sources provide charge carriers of positive sign such as holes.

A "dopant" is an ion, atom, molecule, or other particle that can be added to a channel or other part of an integrated circuit during production and that serves as a charge carrier source when the integrated circuit is in use. An "n-type dopant" provides charge carriers of negative sign and a "p-type dopant" provides charge carriers of positive sign. A "counterdopant" is a second dopant added with a first dopant to reduce the effect of the first dopant by providing charge carriers of opposite sign from those provided by the first dopant.

A process "implants" a dopant if the process causes particles of the dopant to enter a part of an integrated circuit.

An "electric field" is an arrangement of local forces that would act on charged bodies in a region. An electric field can be represented graphically by showing lines of equal magnitude, for example. A "maximum electric field" in a region is a locus at which the local force that would act on a charged body is greater in magnitude than at any other locus in the region.

Densities of charge carrier sources that vary with distance "modify electric field" within a region if the electric field in the region is different than an electric field that would occur under the same conditions but with densities that are constant with distance.

A "transistor" is a component that has a channel that extends between two channel leads, and that also has a third lead-referred to as a "gate lead" or simply "gate'-'—such that the channel can be switched between two states by signals that change potential difference between the gate and one of the channel leads, referred to as the "source." A channel is in its "ON state" when current can readily flow through it and in its "OFF state" when current cannot readily flow through it. The channel lead that is not the source is referred to as the "drain." Other components may have leads called gates, sources, and drains by analogy to transistors.

A "thin-film transistor" or "TFT" is a transistor that is part of a thin-film structure. Each of the terms "thin-film transistor" and "TFT" includes transistors with multiple gates. A TFT's channel "extends in a first dimension away from" a channel lead if the channel extends from the transition where it meets the channel lead in the first dimension toward the other channel lead. A TFT's channel "extends in a second dimension from a side away from the gate lead to a side toward the gate lead" if the side away from the gate lead and the side toward the gate lead are separated by a thickness of the channel.

Charge carrier sources provide charge carriers at densities that "vary in a dimension" if the density of charge carriers provided by the charge carrier sources is different at different positions in the dimension. For example, densities of charge carriers may increase or decrease as the distance from a fixed position in the dimension increases. Similarly, densities of charge carriers "vary in the first and second dimensions" if density of charge carriers is different at different positions in each of the first and second dimensions and if the first and second dimensions are approximately perpendicular.

A "leakage current" is a current that occurs due to non-ideal behavior in a component. For example, in an ideal transistor, no current would flow between source and drain when the channel is in its OFF state and no current would flow between the gate and either of the other leads at any time.

B. General Features

Figure 1:
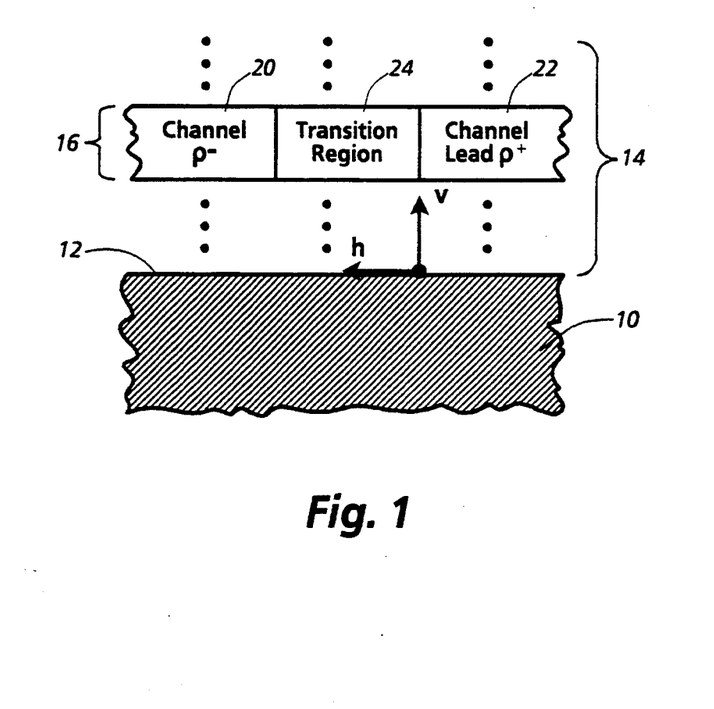
FIG. 1 is a schematic diagram showing a partial cross-section of a thin-film transistor with a transition region that includes a transition between a channel and a channel lead.
Figure 2:
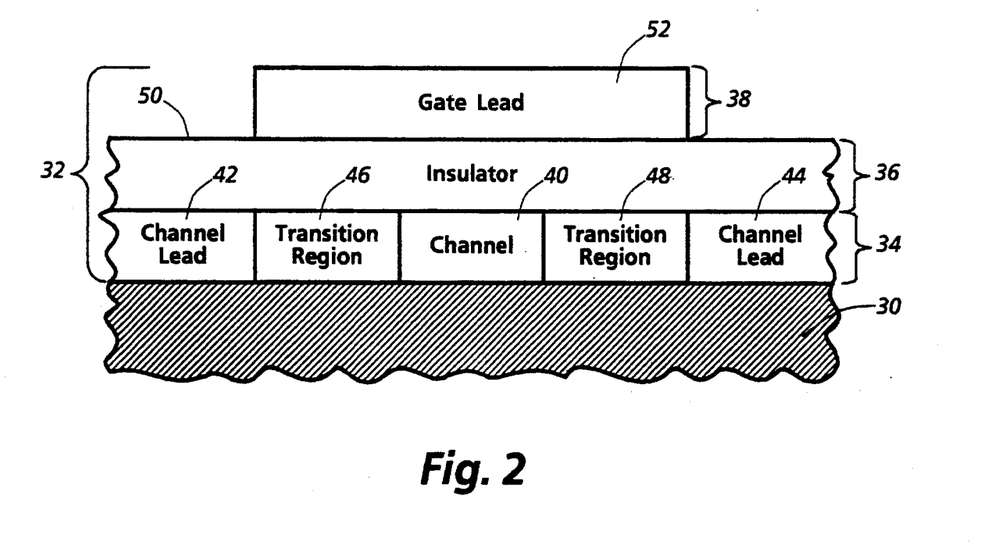
FIG. 2 is a schematic diagram showing a cross-section of a thin-film transistor with transition regions between a channel and each of its channel leads.
Figure 3:
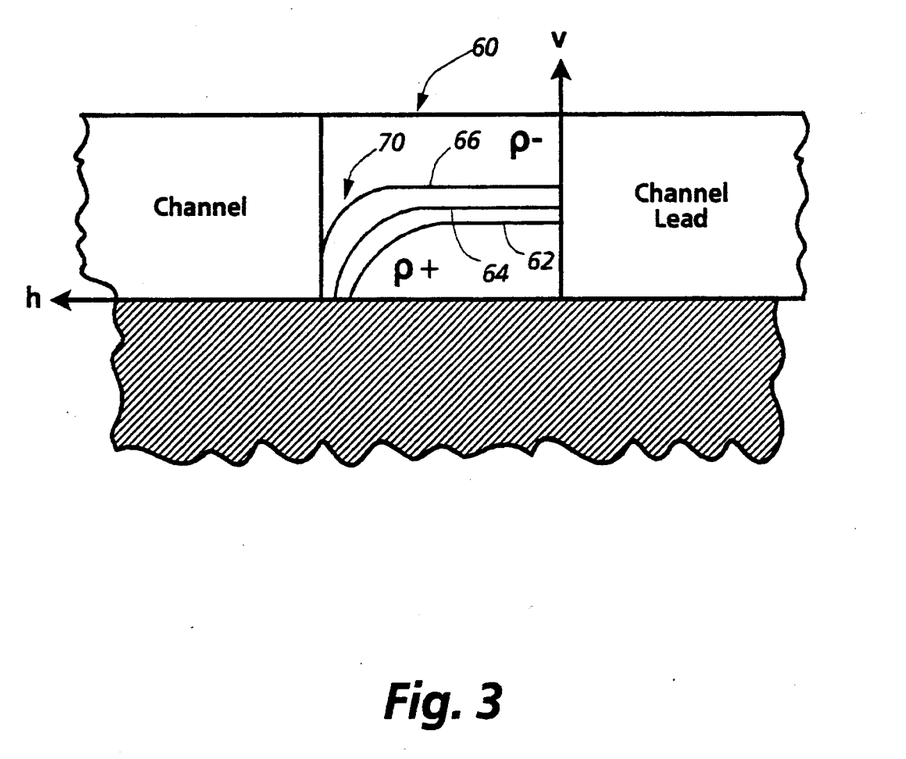
FIG. 3 is a schematic cross-section view of a transition region like that in FIGS. 1 and 2, showing lines of equal charge carrier density to illustrate how densities of charge carriers can vary with distance from a gate lead in the transition region.

FIGS. 1–3 illustrate general features of the invention. FIG. 1 shows a schematic partial cross-section of a channel layer in a thin-film transistor (TFT); a transition region in the channel layer includes the transition between a channel and a channel lead. FIG. 2 shows a schematic cross-section of a symmetric TFT with two transition regions. FIG. 3 shows an example of how densities of charge carriers at a transition between a channel and a channel lead can vary in a dimension in which the channel extends from a side away from a gate lead to a side toward a gate lead.

FIG. 1 shows insulating substrate 10 with surface 12 at which TFT 14 is formed by processes such as deposition and patterned etching of films. TFT 14 includes channel layer 16, and also includes other layers above and below channel layer 16, as indicated by the ellipses in FIG. 1. Channel layer 16 includes channel 20, channel lead 22, and transition region 24 that includes the transition between channel 20 and channel lead 22.

Charge carriers in channel 20 have densities of $\rho-$, indicating that the channel is lightly doped or undoped, while charge carriers in the channel lead have densities of $\rho+$, indicating that the channel lead is heavily doped. Within transition region 24, densities of charge carriers make a transition from $\rho-$ to $\rho+$. As illustrated below with various examples, the transition between a channel and a channel lead can take many forms.

Surface 12 and channel layer 16 extend in a horizontal dimension h, as indicated, which could be referred to as "horizontal." As illustrated, positions within transition region 24 can be measured from an origin on surface 12 at a position aligned with the boundary between channel lead 22 and transition region 24. Within channel layer 16, transition region 24 extends in horizontal dimension h from channel lead 22 to channel 20, and channel 20 then extends further in dimension h. Channel 20 and transition region 24 each have a first side toward surface 12, which is ordinarily away from a gate lead, and a second side away from surface 12, ordinarily toward the gate lead. Channel 20 and transition region 24 extend in dimension v, which could be referred to as "vertical," from their first sides to their second sides.

FIG. 2 shows insulating substrate 30 with a surface at which TFT 32 is formed by processes such as deposition and patterned etching of films. TFT 32 includes channel layer 34, insulating layer 36, and gate layer 38. Channel layer 34 includes channel 40, channel leads 42 and 44, transition region 46 including the transition between channel 40 and channel lead 42, and transition region 48 including the transition between channel 40 and channel lead 44. Insulating layer 36 includes insulator 50, electrically isolating channel layer 34 from gate lead 52 in gate layer 38.

In TFT 32, gate lead 52 extends alongside channel 40 so that channel 40 can be switched between its ON and OFF states by changing potential difference between gate lead 40 and one of channel leads 42 and 44 which is serving as a source. The other of channel leads 42 and 44 serves as a drain, and the densities of charge carriers in the transition region adjacent to the drain result in lower leakage current than would occur if the densities of the charge carriers in the transition region did not vary in the v dimension.

FIG. 3 shows densities of charge carriers in transition region 60, illustrating how charge carrier densities could vary in the v dimension in any of transition regions 24, 46, and 48. Transition region 60 is illustratively shown with a rectangular cross-section having its lower side at the surface of an insulating substrate and being bounded by a channel at its left and a channel lead at its right.

Lines 62, 64, and 66 illustrate how charge carrier densities vary in the h and v dimensions within transition region 60. Each of lines 62, 64, and 66 connects positions of equal charge carrier density, with line 62 connecting positions with a relatively high density, line 64 an intermediate density, and line 66 a relatively low density. Therefore, charge carrier densities decrease as distance from the channel lead in the h dimension increases and also decrease as distance from the substrate in the v dimension increases.

The nearness of lines 62, 64, and 66 to each other indicates a relatively steep gradient of charge carrier densities, separating transition region 60 into two smaller regions: In the region below line 62, charge carrier densities approximate $\rho+$, a density between that of the channel and that of the channel lead; in the region above line 66, charge carrier densities approximate $\rho-$, which can be approximately that of the channel.

Transition regions with charge carrier densities like transition region 60 can be used in a TFT like that shown in FIG. 2 to reduce leakage current. When channel lead 42 is the drain, transition region 46 acts to reduce leakage current; when channel lead 44 is the drain, transition region 48 acts to reduce leakage current. Although FIG. 3 shows a relatively steep gradient of charge carrier densities in transition region 60, a more gradual gradient in a transition region should also reduce leakage current.

Charge carrier densities that vary in the v dimension can reduce leakage current by spreading variations in channel potential over a larger area, thereby changing the magnitude and position of the maximum electric field. For example, the charge carrier densities illustrated in FIG. 3 may reduce the maximum electric field and may move it from near the gate lead to a position nearer the substrate, possibly near "knee" 70 of lines 62, 64, and 66.

Leakage current can be reduced by increasing the distance between the maximum electric field and the region where the density of charge carriers is very high in the OFF state condition. In a typical thin-film structure in which a channel and a gate lead are separated by an insulating layer that is a dielectric substance, the charge carrier density is very high at the dielectric-channel interface. Therefore, as the maximum electric field moves toward "knee" 70, it moves further from the region of very high charge carrier density, reducing leakage current.

FIG. 3 thus illustrates an important difference between conventional LDD techniques and charge carrier densities that vary in the v dimension in a way that reduces leakage current: In a conventional LDD technique, there would inevitably be some small, unintentional variation of charge carrier densities in the v dimension, but there is no evidence that this variation would reduce leakage current.

C. Simulation

The general features described above have been computer simulated using numerical simulation techniques similar to those described and illustrated in Hack, M., Wu, I-W., King, T. J., and Lewis, A. G., "Analysis of Leakage Currents in Poly-Silicon Thin Film Transistors," 1993 International Electron Devices Meeting Technical Digest, pp. 385–388.

Figure 4:
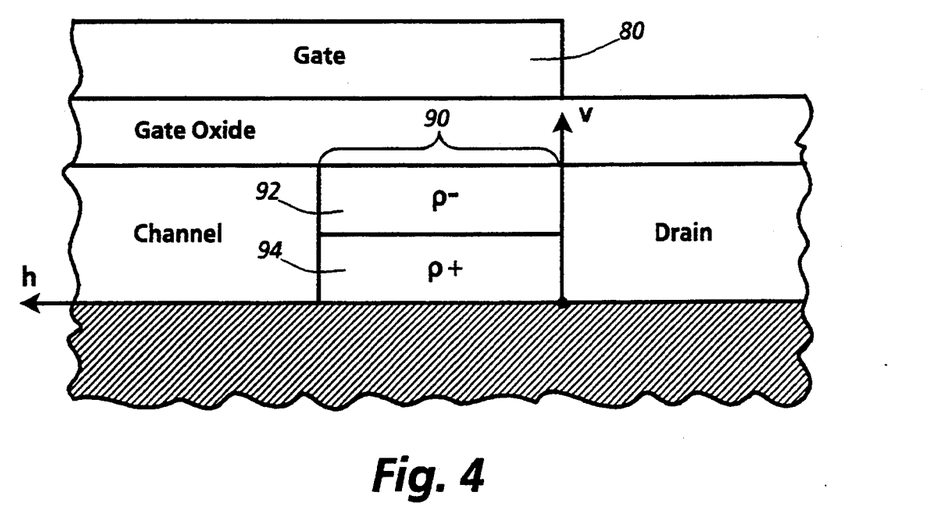
Figure 5:
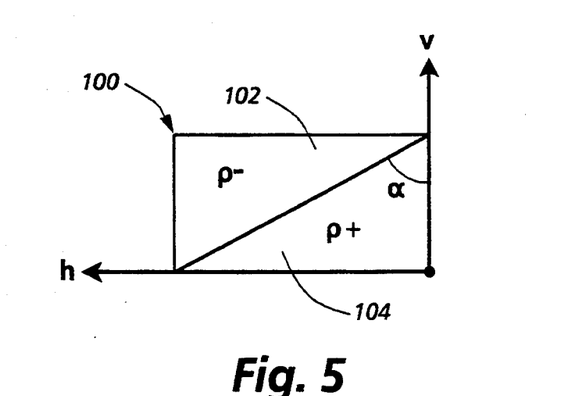
Figure 6:
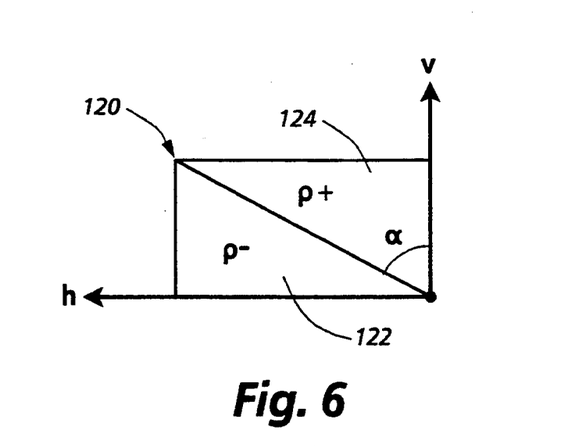
Figure 7:
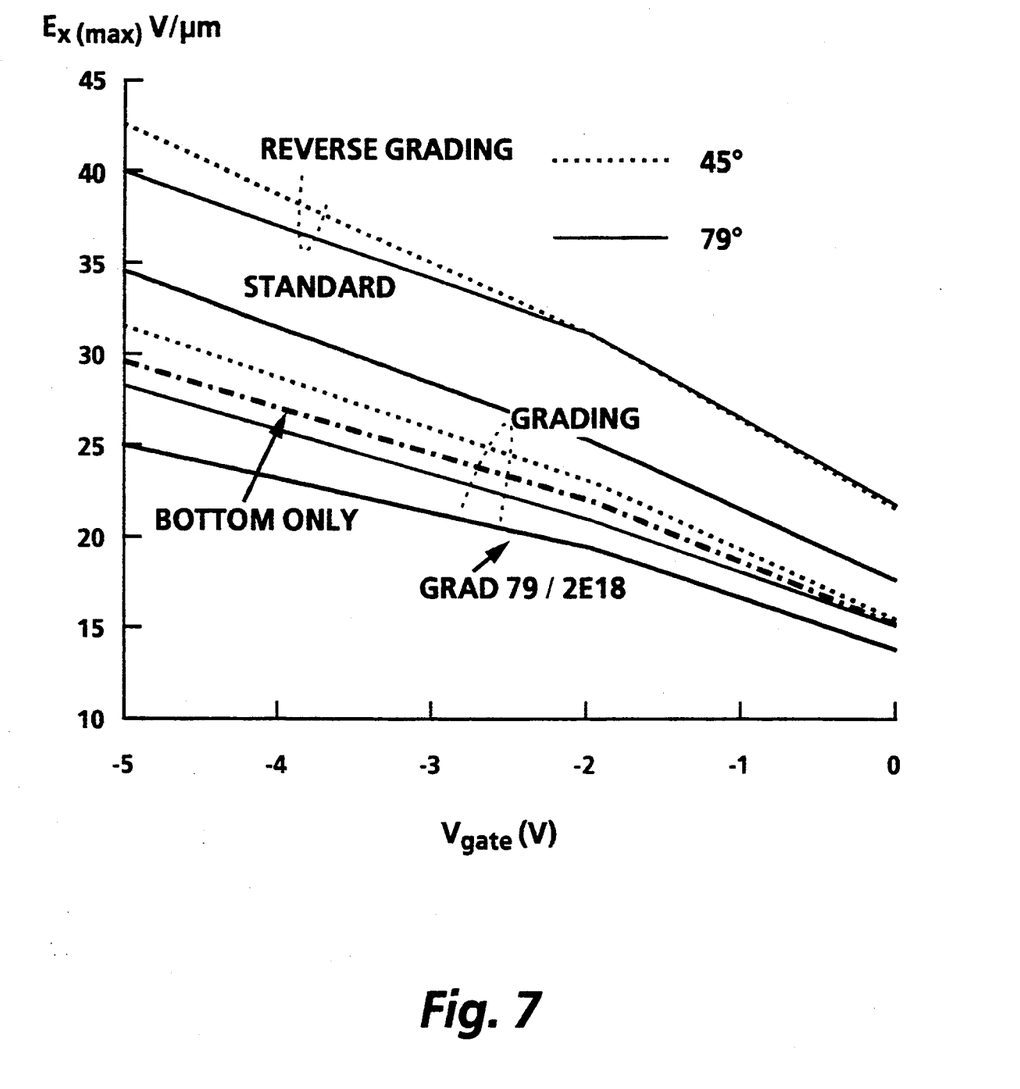
FIG. 7 is a graph showing maximum electric field as a function of gate voltage for several simulated transition region configurations.

FIGS. 4–6 show configurations that were simulated. FIG. 7 is a graph of maximum electric field versus gate voltage, showing simulation results.

FIG. 4 shows a configuration in which gate lead 80 extends alongside transition region 90, and transition region 90 includes smaller regions 92 and 94. In region 92, charge carrier densities approximate $\rho-$, which is that of the channel. In region 94, charge carrier densities approximate $\rho+$, which is that of the drain to which region 94 connects.

Region 94 is a rectangular region that extends from the drain alongside the lower side of the channel layer and is approximately half as thick as the channel layer. Region 92 is a rectangular region that also extends from the drain, but between region 94 and a gate oxide layer. The configuration of regions 92 and 94 is referred to as a "bottom only" configuration.

FIG. 5 shows transition region 100, which includes smaller regions 102 and 104. In region 102, charge carrier densities approximate $\rho-$, which is that of the channel. In region 104, charge carrier densities approximate $\rho+$, which is that of the drain to which region 104 connects.

Region 104 is a triangular region with a first side facing the drain, a second side facing an insulating substrate, and a third side or hypotenuse extending at an angle $\alpha$ from the upper end of the first side to a point on the surface of the insulating substrate where it meets the second side. Region 102 is a similar triangular region with the same hypotenuse as region 104 and with its other two sides parallel to the first and second sides of region 104. The configuration of regions 102 and 104 is referred to as a "grading" configuration.

FIG. 6 shows transition region 120, which includes smaller regions 122 and 124. In region 122, charge carrier densities approximate $\rho-$, which is that of the channel. In region 124, charge carrier densities approximate $\rho+$, which is that of the drain to which region 124 connects.

Region 124 is a triangular region with a first side facing the drain, a second side facing a gate oxide layer, and a third side or hypotenuse extending from the lower end of the first side to a point on the surface of the gate oxide layer where it meets the second side at an angle α. Region 122 is a similar triangular region with the same hypotenuse as region 124 and with its other two sides parallel to the first and second sides of region 124. The configuration of regions 122 and 124 is referred to as a "reverse grading" configuration.

FIG. 7 shows results of a simulation comparing a standard configuration without a transition region with the bottom only configuration, the grading configuration, and the reverse grading configuration. In the standard configuration, a channel extends to the drain, which is uniformly doped. The simulation assumed a channel layer of 0.1 μm thick polycrystalline silicon, a drain to source voltage of 5 volts, a drain uniformly n-doped at a concentration of $10^{20}$ per cm$^3$, and a channel 10 μm in length.

In FIG. 7, the vertical axis shows the maximum electric field in the h dimension $E_{x(max)}$ in volts per micron and the horizontal axis shows the gate to source voltage $V_{gate}$ in volts. For each configuration simulated, the simulation obtained $E_{x(max)}$ for $V_{gate}$ values of $-5$, $-2$, and zero volts. In all cases, $E_{x(max)}$ decreased almost linearly as $V_{gate}$ went from $-5$ to zero volts. The third curve from the top shows the results for the standard configuration.

The dash-dot line below the standard configuration line shows that, for the bottom only configuration, $E_{x(max)}$ is lower than for the standard configuration at all simulated values of $V_{gate}$. This suggests that leakage current would be reduced with the bottom only configuration, because, in general, leakage current is exponentially dependent on $E_{x(max)}$, being approximately proportional to $[\exp(-c/E_{x(max)})]\rho$, where $\rho$ is the density of charge carriers in the leakage channel and c is an appropriate constant.

The dotted line and solid line flanking the dash-dot line show results for the grading configuration with $\alpha=45°$ and $\alpha=79°$ respectively. At other values of $V_{gate}$, for $\alpha=45°$, $E_{x(max)}$ is higher than for the bottom only configuration, while, for $\alpha=79°$, $E_{x(max)}$ is lower than for the bottom only configuration. This suggests that leakage current would be reduced more with $\alpha=79°$ than with the bottom only configuration but would be reduced less with $\alpha=45°$ than with the bottom only configuration.

The lowest solid line shows results for a grading configuration with $\alpha=79°$ but with the concentration of n-dopant in the transition region being $2\times10^{18}$ per cm$^3$, significantly lower than the drain doping concentration. This line suggests that leakage current can be further reduced by doping the transition region more lightly than the drain.

The dotted line and solid line above the standard configuration line show results for the reverse grading configuration with $\alpha=45°$ and $\alpha=79°$ respectively. As shown, $E_{x(max)}$ is higher for either value of α than for the standard configuration, with $\alpha=45°$ producing the highest value of $E_{x(max)}$.

The simulations also showed that the simulated transition regions in the bottom only and grading configurations avoid significant increases in gate overlap capacitance and decreases in drive current. These configurations also push maximum electric field away from the gate lead. The results of the simulations suggest that a grading angle of approximately $\alpha=45°$ or more may be necessary to reduce leakage current.

D. Implementation

The general features described above could be implemented in numerous ways.

D.1. High Angle Ion Implantation

Figure 8:
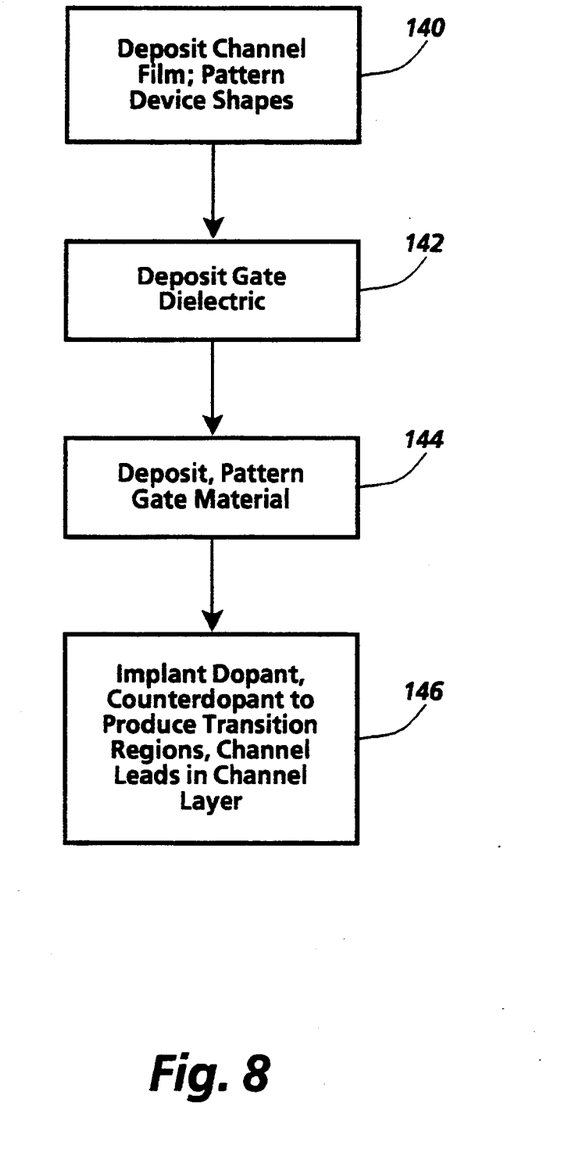
FIG. 8 is a flow chart showing acts in a process that has been used to produce transition regions with high tilt angle implantation.
Figure 9:
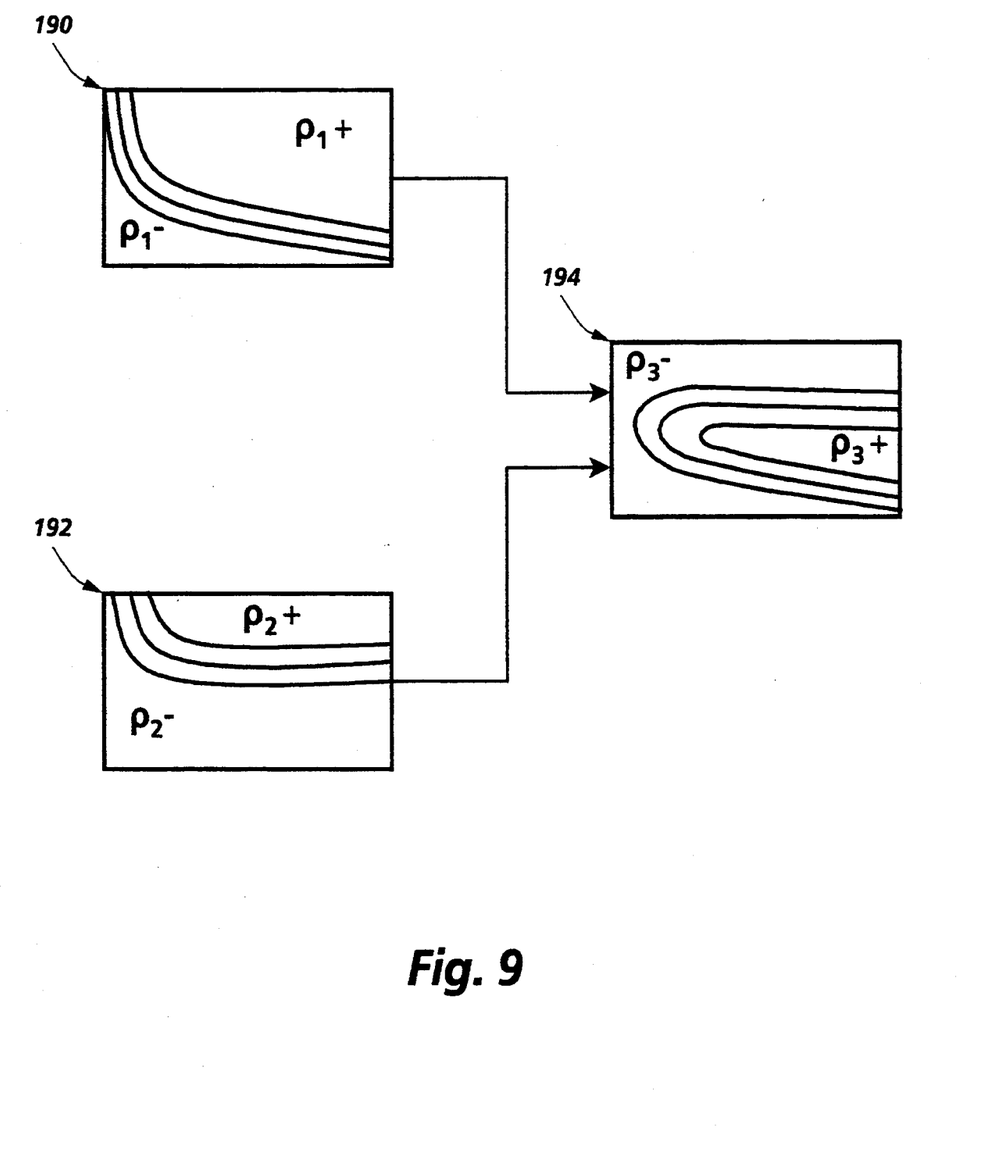
FIG. 9 shows how doping and counterdoping can be used in the process of FIG. 8 to produce a transition region with charge carrier densities that vary with distance from a gate lead.
Figure 10:
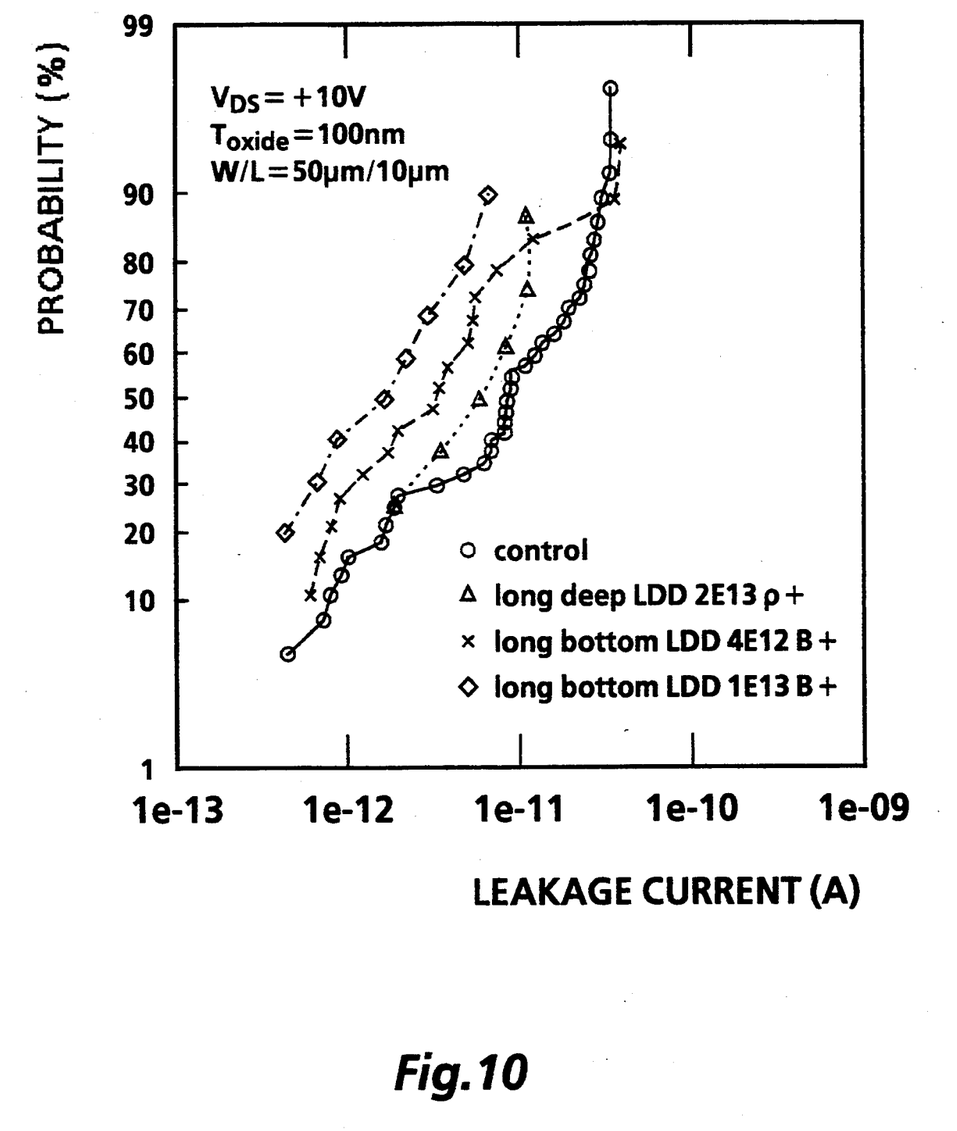
FIG. 10 is a graph showing distributions of leakage currents for four configurations that have been tested.
Figure 11:
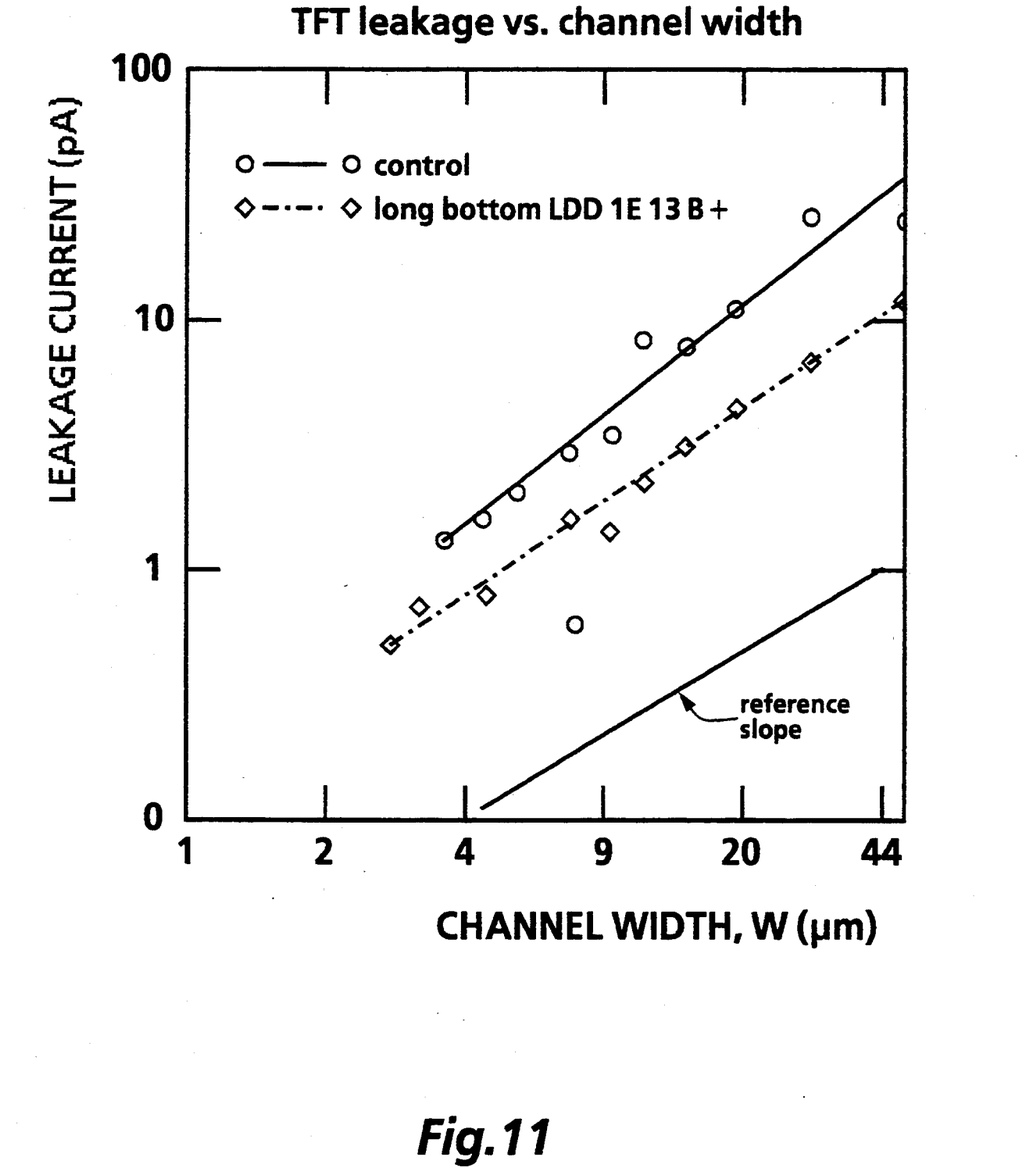
FIG. 11 is a graph showing leakage current as a function of channel width for two of the configurations in FIG. 10.
Figure 12:
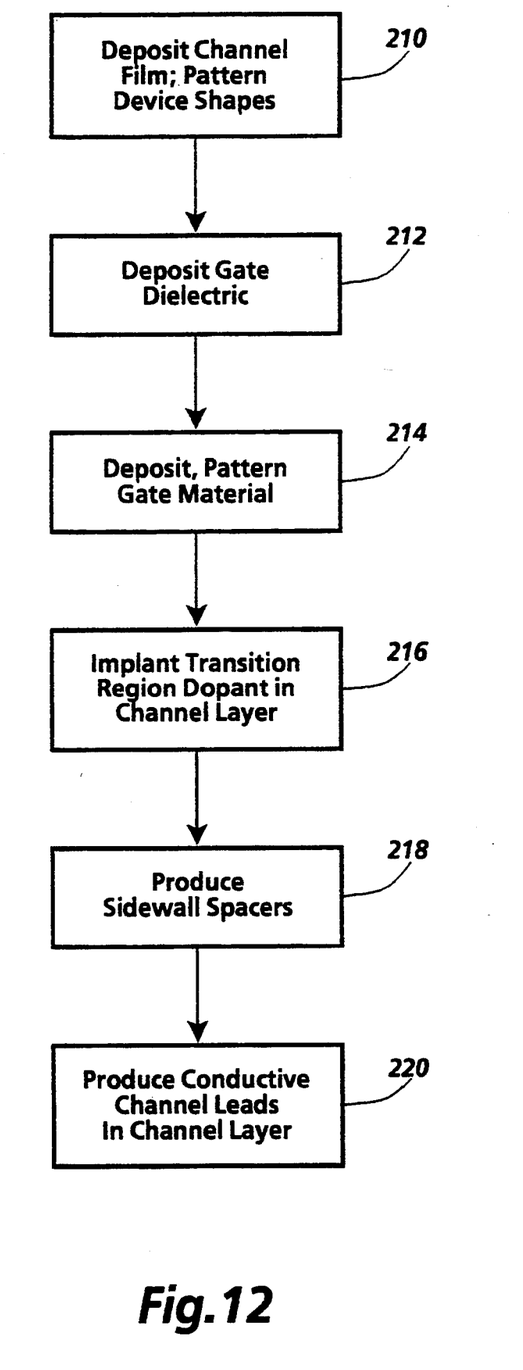
FIG. 12 is a flow chart showing acts in a process that could be used to produce transition regions with sidewall spacers and non-angled implantation.

The general features described above have been implemented experimentally by implanting a dopant at a high tilt angle. FIG. 8 shows acts in producing poly-Si TFTs with transition regions. FIG. 9 shows a cross section of a first transition region that can be produced by acts in FIG. 8. FIG. 10 shows a cross section of a second transition region that can be produced by acts in FIG. 8. FIG. 11 shows distributions of leakage current in several poly-Si TFT configurations including two like that in FIG. 9. FIG. 12 shows TFT leakage as a function of channel width.

The act in box 140 in FIG. 8 deposits a channel film on an insulating substrate, then performs patterning operations such as etching to produce device shapes in the channel film layer. The act in box 140 can be implemented with conventional techniques, and the channel film can be polycrystalline silicon (poly-Si).

The act in box 142 deposits a gate dielectric layer, which can be an oxide of the channel film material. The act in box 144 then deposits a gate material over the gate dielectric layer and performs patterning operations such as etching and implantation to produce conductive gate leads appropriately positioned over portions of the channel film layer. The acts in boxes 142 and 144 can similarly be implemented with conventional techniques.

The act in box 146 implants particles of a dopant and a counterdopant to produce transition regions in areas of the channel film layer under the edges of the gate leads and conductive channel leads in areas of the channel film layer that are not covered by gate leads. This act can be implemented in a number of ways.

The act in box 146 can be implemented by first doping the channel leads with conventional implantation techniques and by then annealing. Then, transition regions can be produced in portions of the channel film layer under the edges of gate leads and adjacent to channel leads that will serve as drains. As described above, charge carrier densities in the transition regions vary in the v dimension.

Alternatively, the act in box 146 could be implemented by first producing transition regions and by then producing the channel leads.

The act in box 146 can produce charge carrier densities that vary in the v dimension in a transition region by implanting both dopant and counterdopant: The act in box 146 can implant dopant ions at high tilt angles in the same way that lightly doped drain (LDD) regions are conventionally formed under gate leads. The act in box 146 can also implant counterdopant ions at high tilt angles and at lower energies to produce lower densities of charge carriers close to the gate lead, as illustrated in FIG. 9.

FIG. 9 shows how charge carrier density profiles 190 and 192 combine to produce transition region 194 with charge carrier densities that vary in two dimensions. Profile 190 can be produced by implanting dopant ions at high tilt angles and with energies similar to those used to produce a conventional LDD region; as a result, the region with a higher charge carrier density $\rho_1+$ is much larger than the region with lower charge carrier density $\rho_1-$. Profile 192 can be produced by implanting counterdopant ions at high tilt angles and at lower energies; as a result, the region with a higher charge carrier density $\rho_2+$ is close to the gate oxide and the region with lower charge carrier density $\rho_2-$ is close to the substrate.

Charge carrier densities in transition region 194 have a profile that is quite similar to the "bottom only" configuration described above in relation to FIG. 4. In transition region 194, the charge carrier density will be $\rho_3 = (\rho_1 - \rho_2)$. Therefore, the region with a higher charge carrier density $\rho_3+$ is positioned away from the gate lead; the region with lower charge carrier density $\rho_3-$ has approximately the same density as the channel.

The technique described in relation to FIG. 9 has been implemented. Sources and drains were n-doped with phosphorus ions (P+) at $1 \times 10^{20}$ cm$^{-3}$. A number of variations were produced on different wafers. In one variation, referred to as the standard configuration, no further doping of the channel layer was performed after doping the sources and drains. In a second, referred to as the LDD configuration, a conventional uniformly doped LDD region was obtained by implanting P+ at an energy of 285 keV at an angle of 56° and a dose of $2 \times 10^{13}$ cm$^{-2}$. In a third, referred to as the lightly counterdoped bottom LDD configuration, a transition region was obtained by first implanting as a dopant P+ at an energy of 285 keV at an angle of 56° and a dose of $2 \times 10^{13}$ cm$^{-2}$, then implanting as a counterdopant boron ions (B+) at an energy of 99 keV at an angle of 72° and a dose of $4 \times 10^{12}$ cm$^{-2}$. In a fourth, referred to as the heavily counterdoped bottom LDD configuration, a transition region was obtained by first implanting P+ at an energy of 285 keV at an angle of 56° and a dose of $2 \times 10^{13}$ cm$^{-2}$, then counterdoping by implanting B+ at an energy of 99 keV at an angle of 72° and a dose of $1 \times 10^{13}$ cm$^{-2}$.

The implementation included a poly-Si channel layer 0.1 μm thick deposited on a glass substrate. An oxide gate dielectric 0.1 μm thick covered the channel layer. The dopant and counterdopant ions were implanted at energies sufficient to penetrate 0.3 μm beyond the edge of the gate lead. The implantation to 0.3 μm succeeded in producing an effective transition region.

Table I summarizes leakage current measurements obtained from the four configurations described above with $V_{DS}=10$ V and with channel width of 50 μm and channel length of 10 μm. As can be seen, the median leakage

TABLE I

| DRAIN DOPING PROFILE | LEAKAGE CURRENT | |
|---|---|---|
| | Median (pA) | 20%-80% Distribution Spread |
| Standard | 9.35 | 16X |
| LDD ($2 \times 10^{13}$ cm$^{-2}$ P+ implant) | 6.10 | 11X |
| Bottom LDD ($4 \times 10^{12}$ cm$^{-2}$ B+ implant) | 3.44 | 11X |
| Bottom LDD ($1 \times 10^{13}$ cm$^{-2}$ B+ implant) | 1.71 | 12X | current and distribution spread both decreased significantly from the standard configuration to the LDD configuration, and the median leakage current further decreased significantly to the two bottom LDD configurations.

FIG. 10 shows more fully the distribution of leakage currents for each configuration in Table I. FIG. 11 shows that leakage current scaled linearly with channel width for representative configurations, ruling out contributions due to edge leakage effects.

The implementation results set forth above verify that a transition region in which charge carrier densities vary in two dimensions can reduce leakage current more effectively in a TFT transistor than a conventional LDD configuration. In addition, since the transition region is under the gate, ON state current in the channel is not sacrificed and OFF state current does not increase.

D.2. Sidewall Spacer and Non-angled Implantation

Figure 13:
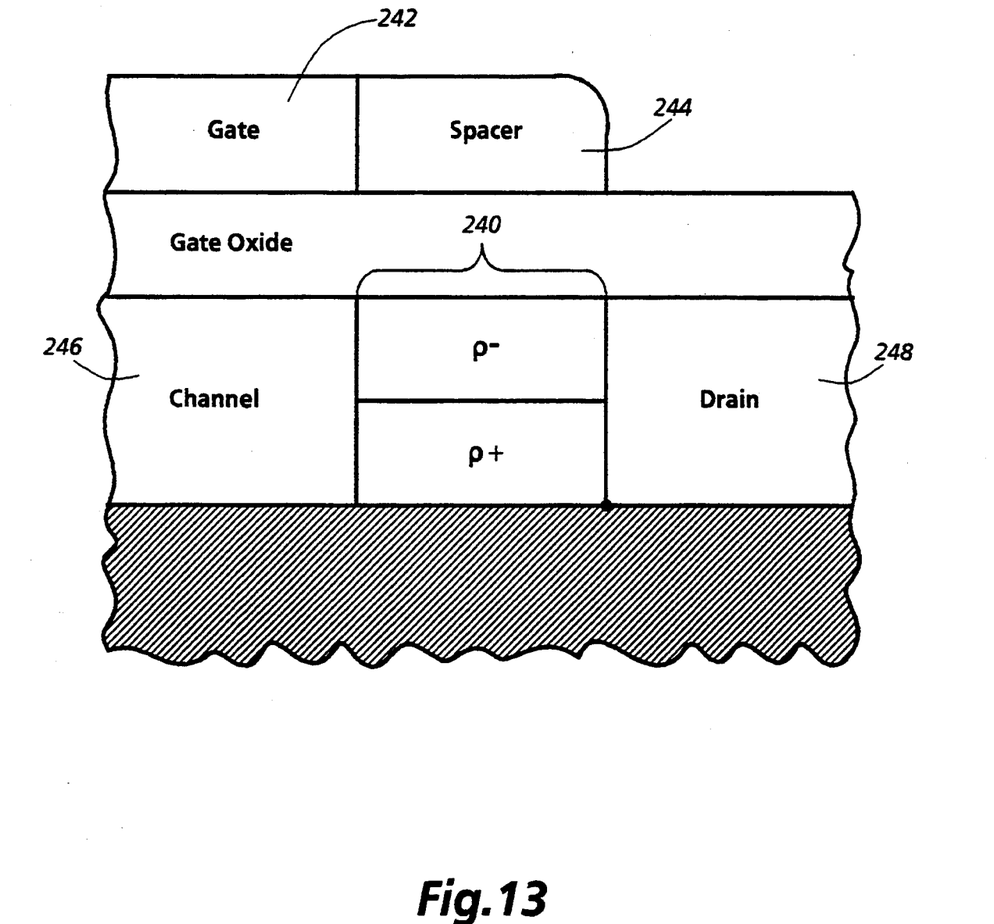
FIG. 13 is a schematic cross-section view of a transition region that would be produced by the acts in FIG. 12.

FIGS. 12 and 13 illustrate an alternative technique for implementing the general features described above. This alternative technique may be advantageous because it eliminates the need for high angle ion implantation, which is a nonconventional process. FIG. 12 shows acts in producing a TFT using the alternative technique. FIG. 13 shows a transition region produced by the alternative technique.

In FIG. 12, the acts in boxes 210, 212, and 214 are the same as the acts in boxes 140, 142, and 144 in FIG. 8, except that the dimensions of devices and gates may be different to allow for sidewall spacers, discussed below.

The act in box 216 begins the production of transition regions by implanting a transition region dopant into the channel layer in all areas not covered by gate leads. This dopant can be implanted with sufficient energy so that the resulting charge carrier densities are significantly greater in a region near the insulating substrate than in a region farther from the substrate. The implantation in box 216 is not at a tilt angle, so that areas under the gates remain undoped.

The act in box 218 then produces sidewall spacers so that the transition regions are covered by gate leads and sidewall spacers. The sidewall spacers can be formed by conventional techniques using a conductive material such as doped silicon or silicon germanium. In effect, the sidewall spacers offset drains from gates, although the drains have not yet been formed.

The act in box 220 produces conductive channel leads in the channel layer, including both drains and sources, by implanting a dopant at a heavy concentration in areas not covered by gates and sidewall spacers. This act can be implemented as in box 146 in FIG. 8.

FIG. 13 shows transition region 240, with a doping profile produced by implanting dopant ions in the act in box 216 after gate 242 has been formed. After the doping of transition region 240, spacer 244 is formed in the act in box 218. Then heavy doping is performed by the act in box 220, leaving channel 246 undoped and transition region 240 with the profile shown, but making drain 248 conductive.

As shown, it is expected that transition region 240 would include two smaller regions: In one region, charge carrier densities approximate $\rho-$, which is that of channel 246; in the other region, charge carrier densities approximate $\rho+$, a density above that of channel 246 but not as high as that of drain 248. The charge carrier densities in transition region 240 are somewhat similar to the "bottom only" configuration described above in relation to FIG. 4.

D.3. Variations

The above implementations could be varied in many ways within the scope of the invention.

The implementations described above include thin film transistors (TFTs), but the invention might also be implemented in other types of thin-film structures. In a structure that does not have a channel lead referred to as a drain, a transition region could be produced adjacent whatever channel lead functions similarly to a drain. Further, the invention could be implemented in a modified TFT structure, such as one with a gate below rather than above the channel layer or with a gate lateral to a channel.

The above implementations employ glass substrates, but other insulating substrates could be used.

The above implementations include polycrystalline silicon channels that are n-conductive, but other thin film materials could be used and p-conductive channels could be used.

The above implementations use phosphorus and boron dopants, but other dopants could be used, such as arsenic. Further, it may be possible to implement the invention with other types of charge carrier sources, such as an additional lead adjacent to the transition region which can induce charge into the transition region; the induced charge would fall off in the v dimension with distance from the lead.

The above implementations use high angle tilt implantation and non-angle implantation, but other techniques for introducing a dopant could be applied.

The above implementations are described in terms of particular profiles of charge carrier densities that vary in two dimensions, but the invention might be implemented with many other profiles. Further, carrier source densities in a transition region might range from the defect density, approximately $10^{16}$ cm$^{-3}$ in poly-Si, up to the channel lead density.

The above implementations are shown in relation to transition regions that have a length greater than their thickness, but length and thickness could be adjusted to whatever dimensions prove optimal. It may be that a thickness greater than the length may be better in some situations.

The above implementations are described as alternatives to other techniques such as lightly doped drain (LDD) structures and double diffused drain (DDD) structures or multiple gate structures. The invention could, however, be used in combination with LDD, DDD, or multiple gate structures to obtain improved results.

In the implementations described in relation to FIGS. 8 and 12, operations could to some extent be performed in a different order. For example, the channel leads could be produced either before or after the transition regions in FIG. 8.

The above implementations show transition regions with rectangular cross sections, but transition regions could have any other appropriate shape.

E. Application

The invention could be applied in many ways, including large-area electronics applications such as active-matrix liquid-crystal displays and image sensors.

F. Miscellaneous

The invention has been described in relation to implementations in which leakage current is reduced. The invention might also be implemented for other purposes.

Although the invention has been described in relation to various implementations, together with modifications, variations, and extensions thereof, other implementations, modifications, variations, and extensions are within the scope of the invention. The invention is therefore not limited by the description contained herein or by the drawings, but only by the claims.

What is claimed:

1. A product comprising:
   an insulating substrate; and
   a thin-film transistor on the substrate; the thin-film transistor having a gate lead and a channel layer; the channel layer including first and second channel leads and a channel extending between the first and second channel leads; the channel and the first channel lead meeting at a transition; the gate lead extending alongside the channel; the channel extending in a first dimension away from the first channel lead and also extending in a second dimension from a side away from the gate lead to a side toward the gate lead; the second dimension being approximately perpendicular to the first dimension;
   the channel layer containing charge carrier sources; the charge carrier sources providing charge carriers at densities that vary in the first and second dimensions; the densities of the charge carriers varying in the second dimension at the transition between the first channel lead and the channel in such a way that a leakage current that occurs when the first channel lead serves as a drain for the transistor is less than a leakage current that would occur if the densities of charge carriers did not vary in the second dimension at the transition between the first channel lead and the channel.

2. The product of claim 1 in which the channel layer includes a transition region; the transition region including the transition between the first channel lead and the channel at which the densities of the charge carriers vary in the second dimension; the gate lead extending alongside the transition region.

3. The product of claim 1 in which the densities of the charge carriers further vary in the second dimension between the second channel lead and the channel in such a way that a leakage current that occurs when the second channel lead serves as a drain for the transistor is less than a leakage current that would occur if the densities of charge carriers did not vary in the second dimension at the transition between the second channel lead and the channel.

4. The product of claim 1 in which the channel layer is formed of polycrystalline silicon.

5. The product of claim 1, further comprising active-matrix liquid-crystal display circuitry on the substrate, the active-matrix liquid-crystal display circuitry including the thin-film transistor.

6. The product of claim 1, further comprising image sensor circuitry on the substrate, the image sensor circuitry including the thin-film transistor.

7. The product of claim 1 in which the thin-film transistor is an n-channel transistor and the charge carrier sources are particles of an n-type dopant.

8. The product of claim 1 in which the thin-film transistor is a p-channel transistor and the charge carrier sources are particles of a p-type dopant.

9. The product of claim 1 in which, when the channel is in an ON state, current flows through the channel in the first dimension; the densities of charge carriers decreasing as distance from the first channel lead in the first dimension increases.

10. The product of claim 1 in which the densities of charge carriers at the transition between the first channel lead and the channel increase as distance from the gate lead in the second dimension increases.

* * * * *